(12) United States Patent
Shu et al.

(10) Patent No.: US 11,563,085 B2
(45) Date of Patent: Jan. 24, 2023

(54) TRANSISTORS WITH SEPARATELY-FORMED SOURCE AND DRAIN

(71) Applicant: GLOBALFOUNDRIES U.S. Inc., Santa Clara, CA (US)

(72) Inventors: Jiehui Shu, Clifton Park, NY (US); Baofu Zhu, Clifton Park, NY (US); Haiting Wang, Clifton Park, NY (US); Sipeng Gu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 91 days.

(21) Appl. No.: 17/243,832

(22) Filed: Apr. 29, 2021

(65) Prior Publication Data
US 2021/0249508 A1     Aug. 12, 2021

Related U.S. Application Data

(62) Division of application No. 16/541,600, filed on Aug. 15, 2019, now Pat. No. 11,075,268.

(51) Int. Cl.
*H01L 29/08* (2006.01)
*H01L 29/66* (2006.01)
(Continued)

(52) U.S. Cl.
CPC .............. *H01L 29/0847* (2013.01); *H01L 21/823814* (2013.01); *H01L 21/823821* (2013.01);
(Continued)

(58) Field of Classification Search
CPC .......... H01L 29/0847; H01L 29/66795; H01L 29/785; H01L 21/823814; H01L 21/823821
See application file for complete search history.

(56) References Cited

U.S. PATENT DOCUMENTS

| 5,648,286 A | 7/1997 | Gardner et al. |
| 6,794,256 B1 | 9/2004 | Fuselier et al. |

(Continued)

FOREIGN PATENT DOCUMENTS

TW    201806151 A    2/2018

OTHER PUBLICATIONS

Taiwan Intellectual Property Office, Allowance Decision in Taiwanese Patent Application No. 109123898, 3 pages.
(Continued)

*Primary Examiner* — Marc Anthony Armand
(74) *Attorney, Agent, or Firm* — Thompson Hine LLP; Francois Pagette

(57) ABSTRACT

Structures for a field-effect transistor and methods of forming a structure for a field-effect transistor. A gate structure is arranged over a channel region of a semiconductor body. A first source/drain region is coupled to a first portion of the semiconductor body, and a second source/drain region is located in a second portion the semiconductor body. The first source/drain region includes an epitaxial semiconductor layer containing a first concentration of a dopant. The second source/drain region contains a second concentration of the dopant. The channel region is positioned in the semiconductor body between the first source/drain region and the second source/drain region.

20 Claims, 2 Drawing Sheets

(51) Int. Cl.
    *H01L 27/092*      (2006.01)
    *H01L 21/8238*     (2006.01)
    *H01L 29/78*       (2006.01)

(52) U.S. Cl.
    CPC .... *H01L 27/0924* (2013.01); *H01L 29/66795* (2013.01); *H01L 29/785* (2013.01)

(56) References Cited

U.S. PATENT DOCUMENTS

| | | |
|---|---|---|
| 7,354,839 B2 | 4/2008 | Wei et al. |
| 7,989,297 B2 | 8/2011 | Yin et al. |
| 10,192,872 B2 | 1/2019 | Widjaja et al. |
| 10,249,755 B1 * | 4/2019 | Cheng ................. H01L 21/3086 |
| 10,276,716 B2 | 4/2019 | Liao et al. |
| 2011/0049582 A1 | 3/2011 | Johnson et al. |
| 2015/0214368 A1 | 7/2015 | Chang et al. |

OTHER PUBLICATIONS

Taiwan Intellectual Property Office, Examination Report in Taiwanese Patent Application No. 109123898.

* cited by examiner

TRANSISTORS WITH SEPARATELY-FORMED SOURCE AND DRAIN

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current.

The source and drain of a field-effect transistor are simultaneously formed. One approach is to implant ions containing a p-type dopant or an n-type dopant into regions of the body adjacent to the gate electrode to provide the source and drain. Another approach is to epitaxially grow sections of a semiconductor material from the body to form the source and drain. The semiconductor material is in situ doped during epitaxial growth with either a p-type dopant or an n-type dopant.

The operating characteristics of a field-effect transistor depend, among other factors, on the manner in which the source and drain are formed. Because of their simultaneous formation by either ion implantation or epitaxial growth, the properties of the source and drain cannot be separately engineered to optimize the operating characteristics of the field-effect transistor for certain design applications.

Improved structures for a field-effect transistor and methods of forming a structure for a field-effect transistor are needed.

SUMMARY

In an embodiment of the invention, a structure for a field-effect transistor is provided. The structure includes a semiconductor body having a channel region, a gate structure over the channel region, a first source/drain region including an epitaxial semiconductor layer coupled to a first portion of the semiconductor body, and a second source/drain region in a second portion of the semiconductor body. The channel region is positioned in the semiconductor body between the first source/drain region and the second source/drain region. The epitaxial semiconductor layer of the first source/drain region contains a first concentration of a dopant, and the second source/drain region contains a second concentration of the dopant.

In an embodiment of the invention, a method of forming a field-effect transistor is provided. The method includes forming a gate structure over a channel region in a semiconductor body, epitaxially growing a semiconductor layer containing a first concentration of a dopant from a first portion of the semiconductor body to provide a first source/drain region, and ion implanting a second portion of the semiconductor body to form a second source/drain region containing a second concentration of the dopant. The channel region is positioned in the semiconductor body between the first source/drain region and the second source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
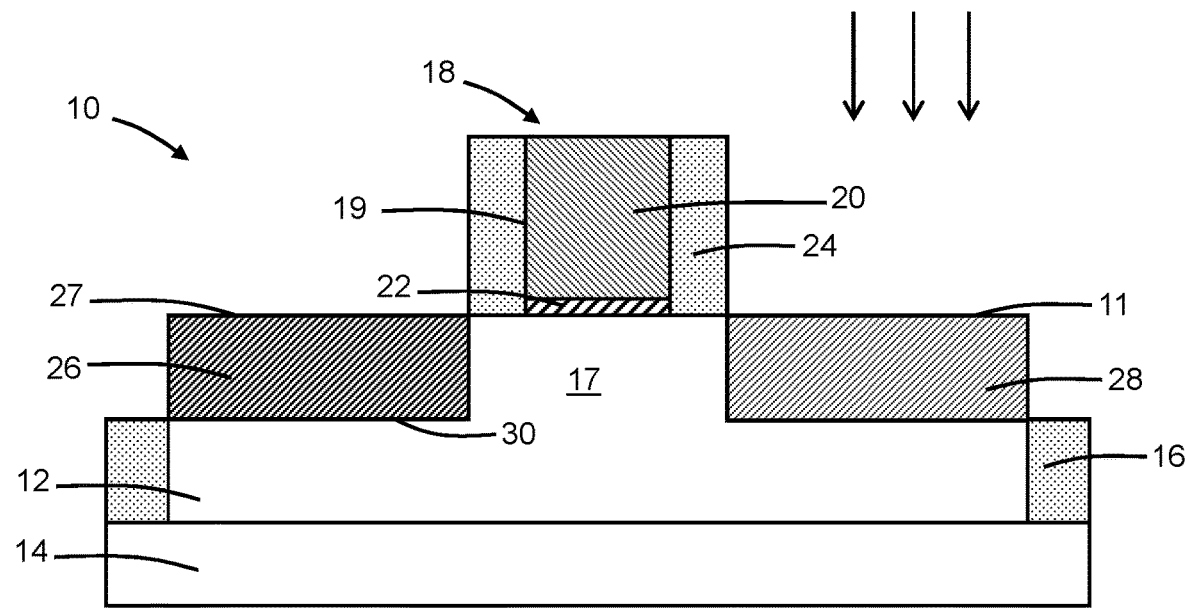
FIG. 1 is a cross-sectional view of a structure for a fin-type field-effect transistor in accordance with embodiments of the invention.

With reference to FIG. 1 and in accordance with embodiments of the invention, a structure 10 for a field-effect transistor includes a fin 12 that is arranged over, and projects upwardly away from, a substrate 14. The fin 12 and the substrate 14 may be composed of a single-crystal semiconductor material, such as single-crystal silicon. The fin 12 may be formed by patterning the substrate 14 with lithography and etching processes or by a self-aligned multi-patterning process.

A shallow trench isolation region 16 may surround the fin 12. The shallow trench isolation region 16 may be formed by depositing a layer composed of a dielectric material, such as silicon dioxide, by chemical vapor deposition, and recessing the deposited layer with an etching process. An upper portion of the fin 12 is revealed above a top surface of the shallow trench isolation region 16.

A gate structure 18 extends laterally along a longitudinal axis over and across the fin 12. The gate structure 18 is aligned transverse to the fin 12 and overlaps with, and wraps about, the top surface 11 and sidewalls of a portion (e.g., a channel region 17) of the fin 12. The gate structure 18 is also arranged in part on the top surface of the shallow trench isolation region 16 on opposite sides of the fin 12. The gate structure 18 may include a gate electrode 20 composed of a conductor, such as doped polycrystalline silicon (i.e., polysilicon) or a work function metal, and a gate dielectric 22 composed of an electrical insulator, such as silicon dioxide or a high-k dielectric material such as hafnium oxide. The gate structure 18 may be formed by a gate-first process flow or by a gate-last process flow involving replacement of a dummy gate structure. The gate structure 18 may be a metal gate having a width in a range of 20 nanometers to 300 nanometers (e.g., 150 nanometers), and the gate dielectric 22 may be composed of hafnium oxide with a thickness of about 2 nanometers.

Sidewall spacers 24 are arranged adjacent to the side surfaces or sidewalls 19 of the gate structure 18. The sidewall spacers 24 may be formed by depositing a conformal layer composed of a dielectric material, such as silicon nitride, and etching the deposited conformal layer with an anisotropic etching process, such as reactive ion etching.

The structure 10 includes source/drain regions 26, 28 that are arranged adjacent to the opposite spacer-clad sidewalls 19 of the gate structure 18. As used herein, the term "source/drain region" means a doped region of semiconductor material that can function as either a source or a drain of a field-effect transistor. In an embodiment, the source/drain region 26 may provide a source in the structure 10, and the source/drain region 28 may provide a drain in the structure 10. In an alternative embodiment, the source/drain region 26 may provide a drain in the structure 10, and the source/drain region 28 may provide a source in the structure 10. The source/drain regions 26, 28 are doped to have a conductivity type of the same polarity, are formed at different points in time of the process flow, and are arranged adjacent to opposite spacer-clad sidewalls 19 of the same gate structure 18. The source/drain region 26 may be formed either before or after the formation of the source/drain region 28. The fin 12 provides a semiconductor body used to form the source/drain regions 26, 28, which are asymmetrical due to the different manner in which each is formed.

The source/drain region 26 is provided by an epitaxial semiconductor layer that is coupled to a portion of the semiconductor body provided by the fin 12. More specifically, a cavity 30 is etched in the fin 12 adjacent to the gate structure 18, and the source/drain region 26 is subsequently formed in the cavity 30. To form the cavity 30, an etch mask may be formed by lithography over portion of the fin 12 including, or that will include, the source/drain region 28. The etch mask may include a layer of, for example, an organic photoresist that is applied by a spin coating process, pre-baked, exposed to light projected through a photomask, baked after exposure, and developed with a chemical developer. After forming the etch mask, the cavity 30 may be formed in the fin 12 by one or more etching processes.

The source/drain region 26 may be formed by the epitaxial growth of a layer of a semiconductor material from surfaces of the fin 12 bordering the cavity 30. The etch mask is stripped, and the portion of the fin 12 in which the source/drain region 28 is formed, or will be formed, may be temporarily covered by a protective layer, such as a protective layer composed of a dielectric material (e.g., silicon nitride) that does not support epitaxial growth and that may be removed after the source/drain region 26 is formed. The source/drain region 26 may be in direct contact with the surfaces of the fin 12 bordering the cavity 30.

The source/drain region 26 may be in situ doped during epitaxial growth with a concentration of a dopant. In an embodiment, the source/drain region 26 may be in situ doped during epitaxial growth with a p-type dopant (e.g., boron) that provides p-type conductivity. In an alternative embodiment, the source/drain region 26 may be in situ doped during epitaxial growth with an n-type dopant (e.g., phosphorus and/or arsenic) that provides n-type conductivity. The source/drain region 26 may contain germanium and, in an embodiment, the source/drain region 26 may be composed of silicon-germanium. In an embodiment, the source/drain region 26 may be composed of silicon-germanium and may contain a p-type dopant. In an alternative embodiment, the source/drain region 26 may be composed of silicon and may contain an n-type dopant.

The source/drain region 28 may be formed by a masked ion implantation process in a portion of the semiconductor body provided by the fin 12. To that end, an implantation mask may be formed by lithography over the portion of the fin 12 including, or that will include, the source/drain region 26. The implantation mask may include a layer of, for example, an organic photoresist that is applied by a spin coating process, pre-baked, exposed to light projected through a photomask, baked after exposure, and developed with a chemical developer. After forming the implantation mask, the source/drain region 28 may be formed in portion of the fin 12 by implanting ions of a dopant.

The source/drain region 28 contains a concentration of an n-type or p-type dopant. In an embodiment, the source/drain region 28 may be formed in the fin 12 by implanting ions of a p-type dopant (e.g., boron) that provides p-type electrical conductivity. In an alternative embodiment, the source/drain region 28 may be formed in the fin 12 by implanting ions of an n-type dopant (e.g., phosphorus and/or arsenic) that provides n-type conductivity. In an embodiment, the dopant concentrations of the source/drain region 26 and the source/drain region 28 may be equal or substantially equal. In an embodiment, the dopant concentrations of the source/drain region 26 and the source/drain region 28 may be different (i.e., not substantially equal), which is enabled by the differences in their formation.

Ion implantation introduces energetic ions, as indicated diagrammatically by the single-headed arrows, with ion trajectories that stop over a depth range in the fin 12. The ions may be generated from a suitable source gas and implanted into the fin 12 with given implantation conditions using an ion implantation tool. The implantation conditions (e.g., ion species, dose, kinetic energy, tilt angle) may be selected to tune the characteristics (e.g., depth profile) of the source/drain region 28. The implantation mask has a thickness sufficient to stop the energetic ions before reaching the portion of the fin 12 in which the source/drain region 26 is formed. Following the formation of the source/drain region 28, the implantation mask may be removed by, for example, ashing.

The source/drain region 28 has a top surface that may coincide with a top surface 11 of the fin 12, and the source/drain region 28 is located entirely at and below the top surface 11 of the fin 12. In contrast, the top surface 27 of the source/drain region 26 is not constrained to coincide with the top surface 11 of the fin 12 because the source/drain region 26 represents semiconductor material that is added to the fin 12. Accordingly, the top surface 27 of the source/drain region 26 may be either raised above or recessed below the top surface 11 of the fin 12. Alternatively, the top surface 27 of the source/drain region 26 may be coplanar with the top surface 11 of the fin 12.

The field-effect transistor embodied by the structure 10 may exhibit a reduced leakage on the side of the source/drain region 28 due to the utilization of ion implantation to form the source/drain region 28, while retaining performance benefits derived from the source/drain region 26 containing semiconductor material formed by epitaxial growth. In an embodiment, the field-effect transistor may be used as an input/output transistor in an integrated circuit, and may have a gate length that is longer than typical gate lengths for a logic transistor.

Figure 2:
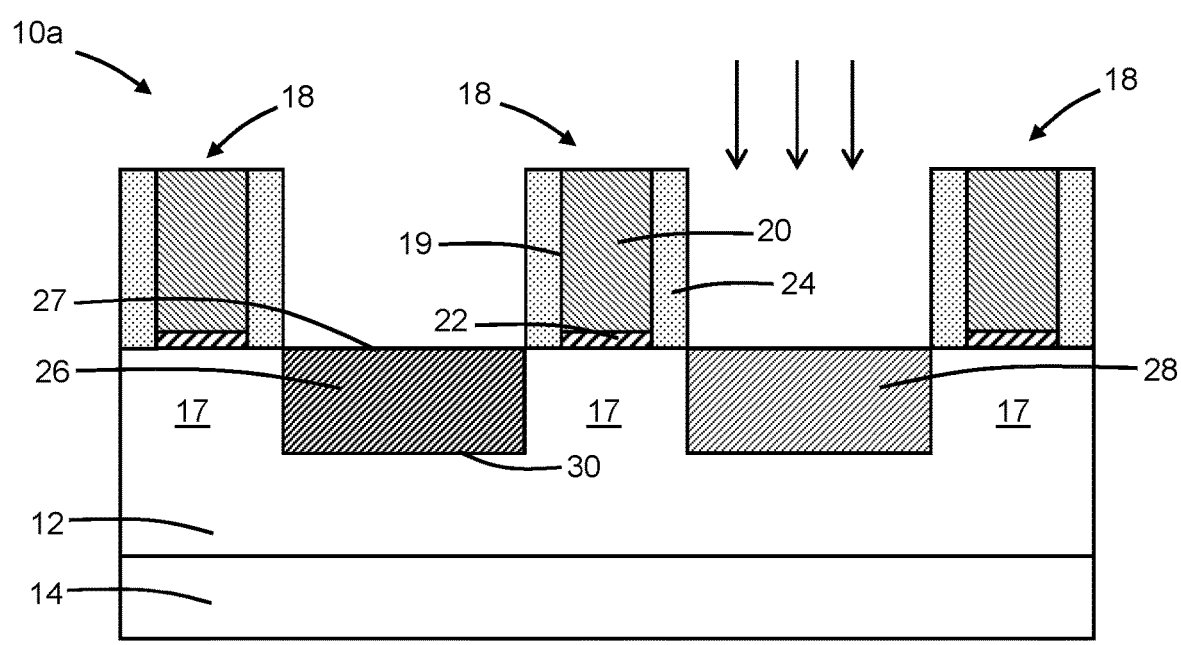
FIG. 2 is a cross-sectional view of a structure similar to FIG. 1 in accordance with alternative embodiments of the invention.

With reference to FIG. 2 in which like reference numerals refer to like features in FIG. 1 and in accordance with embodiments of the invention, the source/drain regions 26, 28 may be included in a structure 10a for a fin-type field-effect transistor in which multiple gate structures 18 extend across the fin 12 and overlap with respective channel regions 17 in the fin 12. The source/drain region 26 is positioned between an adjacent pair of the gate structures 18, and the source/drain region 28 is positioned between an adjacent pair of the gate structures 18. The formation of the source/drain region 26 and the separate formation of the source/drain region 28 may each be, at least in part, self-aligned by the gate structures 18.

Figure 3:
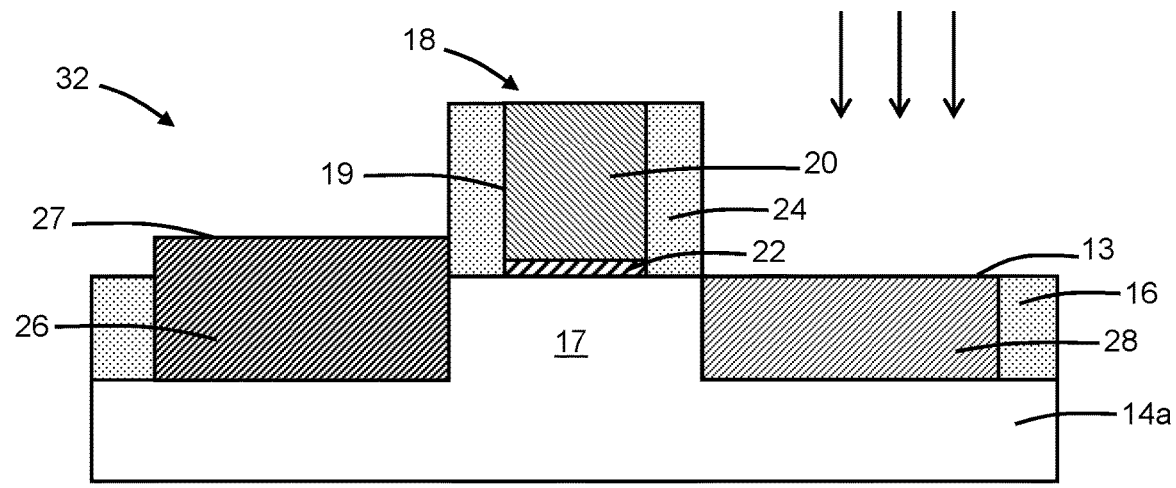
FIG. 3 is a cross-sectional view of a structure for a planar field-effect transistor in accordance with embodiments of the invention.

With reference to FIG. 3 in which like reference numerals refer to like features in FIG. 1 and in accordance with embodiments of the invention, the source/drain regions 26, 28 may be included in a structure 32 for a planar field-effect transistor, instead of the structure 10 for a fin-type field-effect transistor. The substrate 14a provides the portions of the semiconductor body used to form the source/drain regions 26, 28 as previously described. The substrate 14a may be a bulk semiconductor substrate, such as a bulk single-crystal silicon wafer, or a silicon-on-insulator substrate that includes a device layer composed of single crystal semiconductor material (e.g., single-crystal silicon). In an embodiment, the top surface 27 of the source/drain region 26 may be raised relative to a top surface 13 of the substrate 14a. In an embodiment, the top surface 27 of the source/drain region 26 may be recessed relative to the top surface 13 of the substrate 14a.

Figure 4:
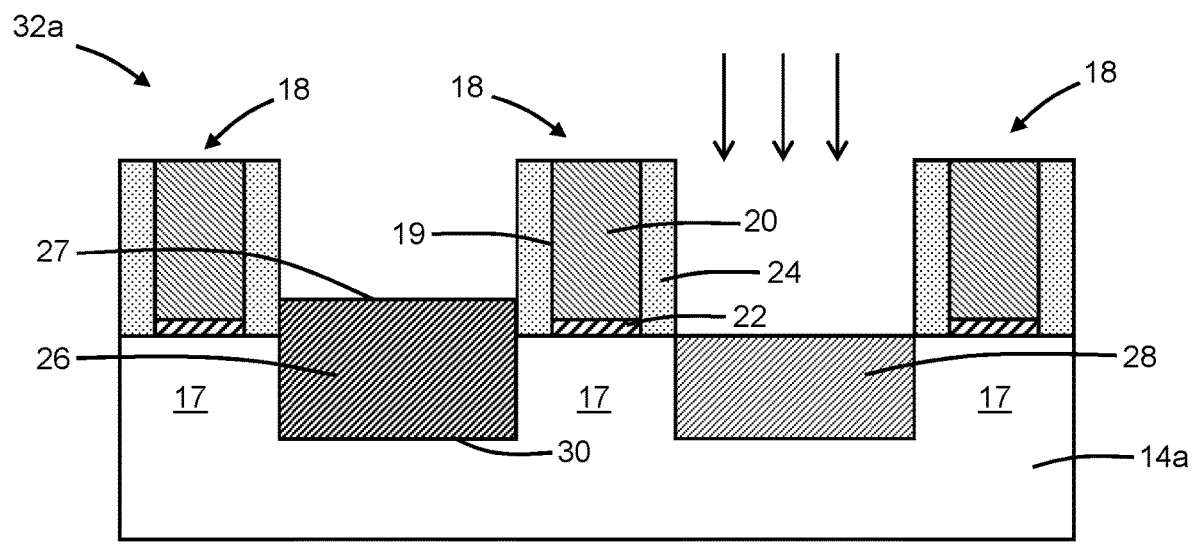
FIG. 4 is a cross-sectional view of a structure similar to FIG. 3 in accordance with alternative embodiments of the invention.

With reference to FIG. 4 in which like reference numerals refer to like features in FIG. 3 and in accordance with embodiments of the invention, the source/drain regions 26, 28 may be included in a structure 32a for a planar field-effect transistor in which multiple gate structures 18 overlap with respective channel regions 17 in the substrate 14a. The source/drain region 26 is positioned between an adjacent pair of the gate structures 18, and the source/drain region 28 is positioned between an adjacent pair of the gate structures 18. The formation of the source/drain region 26 and the separate formation of the source/drain region 28 may each be, at least in part, self-aligned by the gate structures 18.

Example

Different device structures for a fin-type field-effect transistor were assessed by computer simulation using Technology Computer-Aided Design (TCAD) tools to model the electrical characteristics of the different device structures. The modeled device structures were identical with the exception of the source and drain regions. The modeled device structures had total device length of 260 nm including a gate length of 150 nm, a source contact length of 35 nm, and a drain contact length of 35 nm.

For one of the modeled device structures (i.e., Epitaxial S/D regions), both of the source/drain regions were formed from epitaxial semiconductor material containing boron as a p-type dopant. For another of the modeled device structures (i.e., Implanted S/D regions), both of the source/drain regions were formed by an implanted dopant profile located in the substrate and containing boron as a p-type dopant. For another of the modeled device structures (i.e., Asymmetrical device), the source was formed from epitaxial semiconductor material containing boron as a p-type dopant, and the drain was formed by an implanted dopant profile located in the substrate and containing boron as a p-type dopant.

Values of electrical characteristics determined by the TCAD computer simulation for the different device structures are summarized in the Table.

TABLE

| | Idlin µA/um | Idsat µA/um | Rodlin ohm · µm | Idoff nA/Fin | Isoff nA/Fin |
|---|---|---|---|---|---|
| Epitaxial S/D regions | 55 | 707 | 1970 | 7.77 | 0.02 |
| Implanted S/D regions | 26 | 441 | 4531 | 0.195 | 0.038 |
| Asymmetrical device with an epitaxial layer on the drain side | 41 | 631 | 3201 | 0.199 | 0.031 |

As apparent in the Table, the value of the drain current when the transistor is biased in the linear region (Idlin) for the asymmetrical device is between the value of Idlin for the device with epitaxial source/drain regions and the value of Idlin for the device with ion-implanted source/drain regions. Similarly, the value of the drain current when the transistor is biased in the saturation region (Idsat) for the asymmetrical device is between the value of Idsat for the device with epitaxial source/drain regions and the value of Idsat for the device with ion-implanted source/drain regions. The value of the contact resistance (Rodlin) for the asymmetrical device is between the value of Rodlin for the device with epitaxial source/drain regions and the value of Rodlin for the device with ion-implanted source/drain regions.

As also apparent in the Table, the value of the drain leakage current when the transistor is in the off state (Idoff) of the asymmetrical device is comparable to the value of Idoff for the device with ion-implanted source/drain regions, and is significantly less than the value of Idoff for the device with epitaxial source/drain regions. The value of the source leakage current when the transistor is in the off state (Isoff) of the asymmetrical device is between the value of Isoff for the device with epitaxial source/drain regions and the value of Isoff for the device with ion-implanted source/drain regions.

The reduction of the drain leakage current for the asymmetrical device, when the transistor is in the off state, may be achieved without a significant sacrifice of device performance.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a field-effect transistor, the method comprising:
   forming a gate structure over a channel region in a semiconductor body, wherein the semiconductor body is comprised of a single-crystal semiconductor material;
   epitaxially growing a semiconductor layer containing a first concentration of a dopant from a first portion of the semiconductor body to form a first source/drain region; and
   introducing the dopant into a second portion of the semiconductor body to form a second source/drain region comprised of the single-crystal semiconductor material of the semiconductor body and a second concentration of the dopant that is contained in the single-crystal semiconductor material of the semiconductor body,
   wherein the channel region is positioned in the semiconductor body between the first source/drain region and the second source/drain region, and the second source/drain region lacks epitaxial semiconductor material.

2. The method of claim 1 wherein the dopant is a p-type dopant.

3. The method of claim 1 wherein the semiconductor body is a fin.

4. The method of claim 3 further comprising:
   etching a cavity in the fin,
   wherein the first source/drain region is formed by an epitaxial growth process in the cavity in the fin.

5. The method of claim 4 wherein the fin has a top surface, and the first source/drain region has a top surface that is raised above the top surface of the fin.

6. The method of claim 4 wherein the fin has a top surface, and the first source/drain region has a top surface that is recessed below the top surface of the fin.

7. The method of claim 1 wherein the semiconductor body is a bulk semiconductor substrate.

8. The method of claim 7 wherein the first source/drain region has a top surface that is above a top surface of the bulk semiconductor substrate.

9. The method of claim 8 wherein the second source/drain region has a top surface that coincides with the top surface of the bulk semiconductor substrate.

10. The method of claim 7 wherein the first source/drain region has a top surface that is below a top surface of the bulk semiconductor substrate.

11. The method of claim 1 wherein the semiconductor body is a device layer of a silicon-on-insulator substrate.

12. The method of claim 11 wherein the first source/drain region has a top surface that is above a top surface of the device layer of the silicon-on-insulator substrate.

13. The method of claim 12 wherein the second source/drain region has a top surface that coincides with the top surface of the device layer of the silicon-on-insulator substrate.

14. The method of claim 11 wherein the first source/drain region has a top surface that is below a top surface of the device layer of the silicon-on-insulator substrate.

15. The method of claim 1 wherein the semiconductor layer comprises germanium.

16. The method of claim 1 wherein the semiconductor layer comprises silicon-germanium, and the dopant is a p-type dopant.

17. The method of claim 1 wherein the first concentration of the dopant is different from the second concentration of the dopant.

18. The method of claim 1 wherein the first source/drain region is formed before the second source/drain region is formed.

19. The method of claim 1 wherein the first source/drain region is formed after the second source/drain region is formed.

20. The method of claim 1 wherein the dopant is introduced into the second portion of the semiconductor body by ion implantation.

* * * * *